United States Patent
Valtari

(10) Patent No.: US 9,423,434 B2
(45) Date of Patent: Aug. 23, 2016

(54) METHOD AND SYSTEM FOR MEASURING ELECTRICAL QUANTITY IN ELECTRICAL NETWORK

(71) Applicant: ABB TECHNOLOGY AG, Zürich (CH)

(72) Inventor: Jani Valtari, Helsinki (FI)

(73) Assignee: ABB Technology AG, Zurich (CH)

( * ) Notice: Subject to any disclaimer, the term of this patent is extended or adjusted under 35 U.S.C. 154(b) by 232 days.

(21) Appl. No.: 13/968,195

(22) Filed: Aug. 15, 2013

(65) Prior Publication Data

US 2013/0332095 A1 Dec. 12, 2013

Related U.S. Application Data

(63) Continuation of application No. PCT/EP2012/052301, filed on Feb. 10, 2012.

(30) Foreign Application Priority Data

Feb. 15, 2011 (EP) ..................................... 11154476

(51) Int. Cl.
*G01R 21/133* (2006.01)
*G01R 19/25* (2006.01)
*G01R 31/08* (2006.01)

(52) U.S. Cl.
CPC ......... *G01R 21/133* (2013.01); *G01R 19/2509* (2013.01); *G01R 19/2513* (2013.01); *G01R 31/086* (2013.01)

(58) Field of Classification Search
CPC .............. G01R 21/133; G01R 31/086; G01R 19/2513; G01R 19/2509; G01R 19/25
See application file for complete search history.

(56) References Cited

U.S. PATENT DOCUMENTS

| | | |
|---|---|---|
| 4,829,298 A | 5/1989 | Fernandes |
| 5,995,911 A | 11/1999 | Hart |
| 6,236,949 B1 | 5/2001 | Hart |
| 2001/0021896 A1 | 9/2001 | Bertsch et al. |
| 2003/0036864 A1 | 2/2003 | Randall et al. |
| 2003/0105608 A1 | 6/2003 | Hart |
| 2003/0200038 A1 | 10/2003 | Schweitzer et al. |
| 2003/0212512 A1 | 11/2003 | Hart |

(Continued)

FOREIGN PATENT DOCUMENTS

| | | |
|---|---|---|
| EP | 1 134 867 A1 | 9/2001 |
| WO | WO 2010/033839 A1 | 3/2010 |
| WO | WO 2010/054477 A1 | 5/2010 |

OTHER PUBLICATIONS

International Search Report (PCT/ISA/210) issued on Apr. 2, 2012, by the European Patent Office as the International Searching Authority for International Application No. PCT/EP2012/052301.

(Continued)

*Primary Examiner* — Toan Le
(74) *Attorney, Agent, or Firm* — Taft Stettinius & Hollister LLP

(57) ABSTRACT

A method and system for measuring an electrical quantity in an electrical network. The system is configured to obtain samples of the electrical quantity through measurements at different feeders or locations in the electrical network. The measurements are taken in turns and at different time instants, such that a value sequence is created on the basis of the measured samples.

22 Claims, 8 Drawing Sheets

(56) References Cited

U.S. PATENT DOCUMENTS

| | | |
|---|---|---|
| 2003/0220752 A1 | 11/2003 | Hart |
| 2004/0093177 A1 | 5/2004 | Schweitzer et al. |
| 2006/0247874 A1 | 11/2006 | Premerlani et al. |
| 2007/0086134 A1 | 4/2007 | Sweigle et al. |
| 2008/0122673 A1* | 5/2008 | Dyer .................. 341/155 |
| 2008/0281540 A1 | 11/2008 | Sweigle et al. |
| 2009/0076745 A1 | 3/2009 | Sakashita et al. |
| 2009/0089608 A1 | 4/2009 | Guzman-Casillas |
| 2010/0138066 A1 | 6/2010 | Kong |
| 2010/0320838 A1 | 12/2010 | Massie et al. |
| 2011/0035065 A1* | 2/2011 | Schweitzer, III ... H02J 13/0062 700/286 |
| 2011/0071970 A1 | 3/2011 | Massie et al. |
| 2012/0035778 A1 | 2/2012 | Kong |

OTHER PUBLICATIONS

Written Opinion (PCT/ISA/237) issued on Apr. 2, 2012, by the European Patent Office as the International Searching Authority for International Application No. PCT/EP2012/052301.

Extended European Search Report dated Aug. 23, 2011, issued by the European Patent Office in corresponding European Patent Application No. 11154476.3-2216. (8 pages).

Kumar, A. et al., "Intelligent Metering System in Integrated Power Generation & Distribution System of a Steel Complex", Power System Technology and IEEE, pp. 1-8 (Oct. 12, 2008) XP031404388.

* cited by examiner

METHOD AND SYSTEM FOR MEASURING ELECTRICAL QUANTITY IN ELECTRICAL NETWORK

RELATED APPLICATIONS

This application is a continuation under 35 U.S.C. §119 of International application PCT/EP2012/052301 filed on Feb. 10, 2012, designating the U.S., and claiming priority to European application EP 11154476.3 filed in Europe on Feb. 15, 2011. The content of each prior application is hereby incorporated by reference in its entirety.

FIELD

The present disclosure relates to a method and a system for measuring an electrical quantity in an electrical network.

BACKGROUND INFORMATION

Known utility companies can be committed to keeping the power quality of supplied power at a certain level. The utility companies can also be committed to reimbursing customers who suffer through long power outages. Among other things these commitments increase the demand to monitor higher order current or voltage harmonics than previously specified for network protection and control purposes, as well as to locate the fault location in the electrical network quickly in order to minimize the outage time of the power supply or to prevent a build-up of total outage of the power supply due to occasional, incipient faults.

Known protection and control IEDs (Intelligent Electronic Devices) used for distribution network protection and control can have a moderate sampling frequency, for example, between 1 kHz and 2 kHz. This sampling frequency is suitable in obtaining phasor measurements, which can be calculated from the nominal frequency components of the electrical quantities, such as zero voltage, zero current or phase currents and voltages, of the electrical network. For calculating 50 Hz or 60 Hz components of the measurement signals a higher sampling frequency would not provide any benefits.

However, for monitoring the higher order harmonics a sampling frequency of 1 to 2 kHz, for example, may be too low. This is also the case for the fault location purposes, for example, when the fault location calculation is based on a transient phenomenon occurring at an early stage of the fault. The frequency of the transient, which may be used for earth fault location purposes, for example, can lie between 100 Hz and 800 Hz, e.g., and under the 1 kHz limit frequency defined by the Nyqvist theorem when the sampling frequency is 2 kHz. Therefore the sampling frequency of 2 kHz used at present would theoretically be adequate for transient analysis, but in practice, due to a very short duration of the transient, for example, at only a few milliseconds, the sampling frequency of 2 kHz is not adequate for acquiring enough transient data points for accurate fault location calculation.

In order to measure higher order harmonics or in order to measure a bigger amount of transient data points from the transient occurring at the early stage of the fault, the sampling frequency of the intelligent electronic devices could be increased. This, however, will increase the cost of the intelligent electronic devices, the increase of the costs rising to an unacceptable level, for example, if the intelligent electronic devices usable as such should be replaced by new ones only for providing a higher sampling frequency. Therefore, in order to fulfil the commitments relating for example to the monitoring of the higher order harmonics or to minimize the outage times of the power supply by quicker fault location other ways to provide appropriate measuring data should be provided.

SUMMARY

An exemplary method for measuring an electrical quantity in an electrical network is disclosed, the method comprising: measuring samples of the electrical quantity at different feeders or locations of the electrical network in turns one sample at a time and at different time instants such that after a sample of the electrical quantity is measured at a respective feeder or location and at a respective time instant, a next sample of the electrical quantity is measured at a different feeder or location at a next time instant, wherein the measuring of samples of the electrical quantity at other feeders or locations being idle at each time instant the electrical quantity is measured at the respective feeder or location, and creating a value sequence on the basis of the measured samples, at least one individual value of the value sequence corresponding to a measured sample, or a value calculated on the basis of at least one measured sample, wherein the at least one individual value in the value sequence is arranged in an order corresponding to a chronological order of the measured samples.

An exemplary system for measuring an electrical quantity in an electrical network is disclosed, the system comprising: at least two intelligent electronic devices arranged at different feeders or locations of the electrical network, the at least two intelligent electronic devices being configured to measure the electrical quantity of the electrical network and each intelligent electronic device is configured to measure samples of the electrical quantity in turns at different feeders or locations one sample at a time and at different time instants such that after one sample of the electrical quantity is measured at a respective feeder or location at a respective time instant by an associated intelligent electronic device, a next sample of the electrical quantity is measured at a different feeder or location at a next time instant by another intelligent electronic device associated with the different feeder, the intelligent electronic devices at other feeders or locations are idle at these time instants when considering the measuring of samples of the electrical quantity, and one of the intelligent electronic devices is arranged to create a value sequence on the basis of respective measured samples, an individual value of the value sequence corresponding to a measured sample or a value calculated on the basis of at least one measured sample, the values in the value sequence being arranged in a chronological order according to the measured samples.

BRIEF DESCRIPTION OF THE DRAWINGS

In the following the disclosure will be described in greater detail by means of exemplary embodiments with reference to the accompanying drawings, in which.

DETAILED DESCRIPTION

Figure 1:
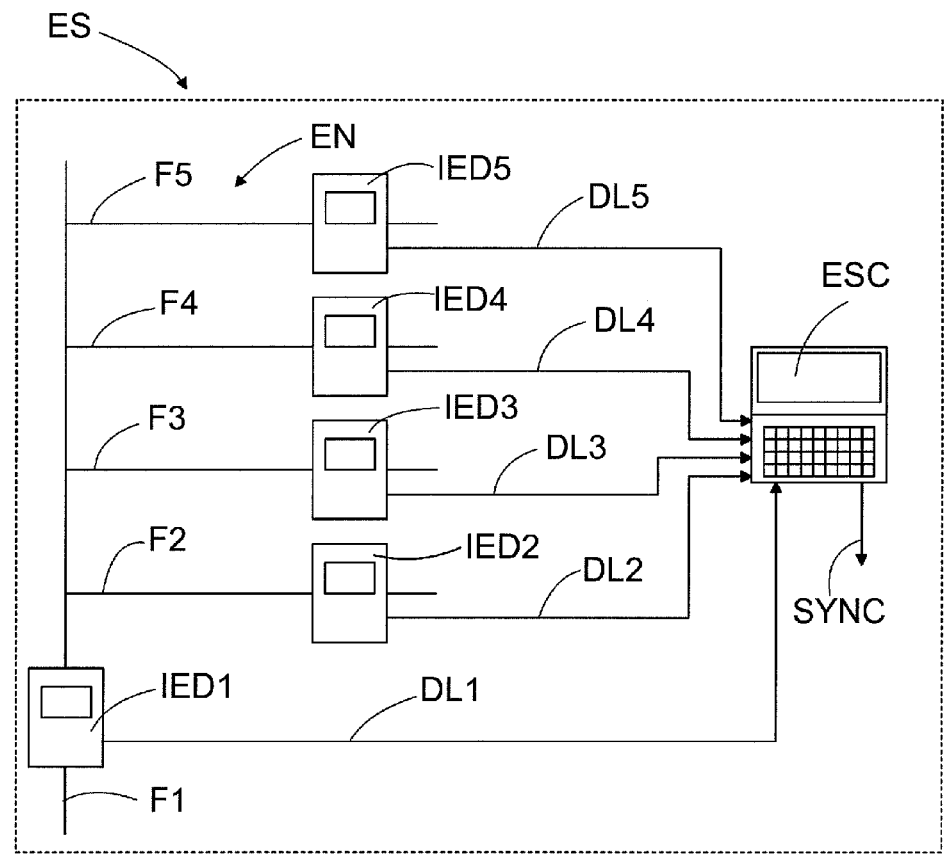
FIG. 1 is a schematic illustration of an electric station in accordance with an exemplary embodiment of the present disclosure.

Exemplary embodiments of the present disclosure provide a novel solution for measuring electrical quantities in an electrical network.

An exemplary method according to the disclosure includes measuring samples of the electrical quantity at different feeders or locations of the electrical network in turns at different time instants, and creating a value sequence on the basis of the measured samples and an individual value of the value sequence corresponds to a measured sample or a value calculated on the basis of at least one measured sample. The values in the value sequence can be arranged in an order corresponding to the chronological order of the measured samples.

An exemplary system according to the disclosure includes at least two intelligent electronic devices arranged at different feeders or locations of the electrical network for measuring the electrical quantity of the electrical network. Each intelligent electronic device can be arranged to measure samples of the electrical quantity in turns at different time instants than any other intelligent electronic device. The system includes an intelligent electronic device arranged to create a value sequence on the basis of the measured samples and an individual value of the value sequence corresponds to a measured sample or a value calculated on the basis of at least one measured sample. The values in the value sequence can be arranged in an order corresponding to the chronological order of the measured samples.

According to an exemplary method for measuring an electrical quantity in an electrical network, samples of the electrical quantity are measured at different feeders or locations of the electrical network at different time instants. A value sequence is created based on the measured samples, wherein an individual value of the value sequence corresponds to a measured sample or a value calculated on the basis of at least one measured sample. The values of the value sequence can be arranged in an order corresponding to the chronological order of the measured samples.

By measuring the same electrical quantity at different feeders or locations of the electrical network such that the samples of the electrical quantity are taken in turns at different feeders at different time instants, the actual sampling frequency of the measured electrical quantity may be increased without increasing the sampling frequency of any individual measurement point. At hardware level this means, that the sampling frequency relating to the above mentioned value sequence containing all the measured samples or values calculates on the basis of the measured samples, is higher than the sampling frequency of any individual intelligent electronic device. Thereby the sampling frequency of the measurement may be increased without increasing the sampling frequency of any individual intelligent electronic device.

According to an exemplary embodiment described herein at least two sample sequences of a same electrical quantity can be measured such that samples of each sample sequence are measured at a different feeder of the electrical network than the samples of any other sample sequence and that the samples of different sample sequences are measured in turns one sample at a time at different time instants and a value sequence is created on the basis of the samples of the sample sequences, wherein an individual value of the value sequence corresponds to a sample of a sample sequence or a value calculated on the basis of at least one sample of at least one sample sequence, and the values of the value sequence can be arranged in an order corresponding to the chronological order of the samples of the sample sequences.

FIG. 1 is a schematic illustration of an electric station in accordance with an exemplary embodiment of the present disclosure. The substation 1 of FIG. 1 includes (e.g., comprises) five feeders, one incoming feeder F1 and four outgoing feeders F2, F3, F4 and F5, the feeders F1 to F5 constituting an electrical network EN. For the sake of clarity only one phase, e.g., only one line denoted by F1, F2, F3, F4 or F5 of each feeder is shown in FIG. 1. Each one of the feeders F1 to F5 includes an intelligent electronic device IED, the incoming feeder F1 including intelligent electronic device IED1 and the outgoing feeders F2 to F5 including intelligent electronic devices IED2, IED3, IED4 and IED5 correspondingly. The intelligent electronic device IED can for example be a data collector, which measures or collects data about an electrical quantity EQ of the electrical network EN. The electrical quantity EQ of the electrical network EN can be for example zero voltage $U_0$, zero current $I_0$, phase voltage U or phase current I. The intelligent electronic device IED may also be a network protection and control unit, such as a protection and control relay, which in addition to data collection functionality provides specified electrical network protection and control functionalities known as such for a person skilled in the art. The internal structure and functionality of an intelligent electronic device IED in view of the measurement solution presented in this description is discussed more detailed later.

The substation ES according to FIG. 1 further includes a substation computer ESC. Each intelligent electronic device IED1 to IED5 is connected to the substation computer ESC by data transmission lines DL1, DL2, DL3, DL4 and DL5 such that any data collected by the intelligent electronic devices IED1 to IED5 or determined by the intelligent electronic devices IED1 to IED5 can be transmitted to the substation computer ESC for further analysis. The internal structure and functionality of the substation computer ESC in view of the measurement solution presented in this description is discussed more detailed later. The substation computer ESC forms or constitutes one kind of an intelligent electronic device too and it is also possible that the functionality of the substation computer ESC can be included in any of the intelligent electronic device IED1 to IED5.

Figure 2:
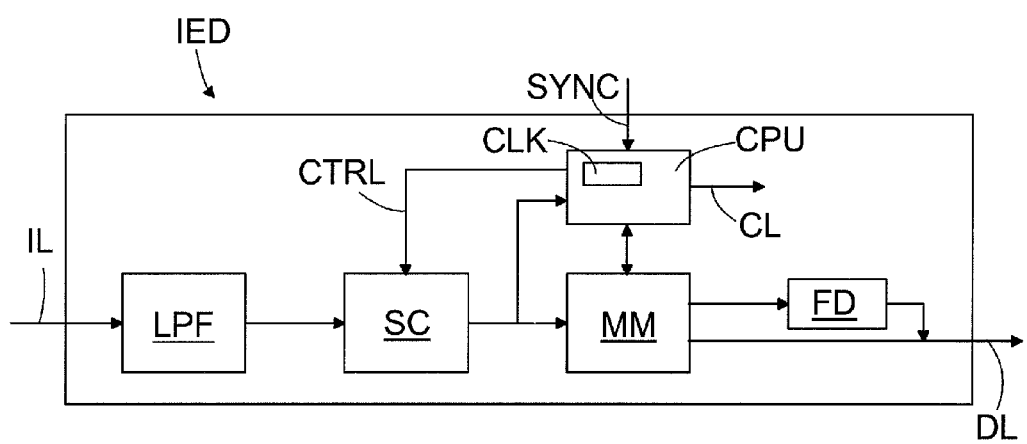
FIG. 2 is a schematic illustration of an intelligent electronic device in accordance with an exemplary embodiment of the present disclosure.

FIG. 2 is a schematic illustration of an intelligent electronic device in accordance with an exemplary embodiment of the present disclosure. In FIG. 2, it is assumed that the intelligent electronic device IED is a network protection and control unit. The internal structure of all the intelligent electronic devices IED1 to IED5 in FIG. 1 can be the same or may vary from each other depending on the purpose of use of each intelligent electronic device IED1 to IED5.

An exemplary intelligent electronic device IED according to FIG. 2 includes an input line IL for receiving an input or measurement signal describing or corresponding the electrical quantity EQ of the electrical network EN to be measured. The intelligent electronic device IED includes further a low pass filter LPF and a sampling circuit SC. The sampling circuit SC can include a sample and hold circuit and an analog-to-digital-converter for measuring or collecting or taking samples of the low pass filtered input signal with a sampling frequency $f_s$, the time interval $\Delta t$ or sampling interval $\Delta t$ between the consecutive samples being thus $1/f_s$. The low pass filter LPF is used to filter away or remove those frequencies of the input signal which are above a border frequency set for the low pass filter LPF. The border frequency set for the low pass filter LPF can be about half of the sampling frequency $f_s$ of the sampling circuit SC. The sampling frequency $f_s$ of the sampling circuit SC of the intelligent electronic device IED can vary depending on the purpose or use of the intelligent electronic device, but in the examples below it is assumed that the sampling frequency $f_s$ of each intelligent electronic device IED1 to IED5 is 2 kHz, unless otherwise informed, whereby the border frequency of the low pass filter LPF is about 1 kHz.

The intelligent electronic device IED of FIG. 2 includes a memory MM, which may be used to store the samples of the input signal to be measured such that the stored samples form or constitute a sample sequence SS of the measured electrical quantity EQ. Further the intelligent electronic device IED includes a central processing unit CPU provided with an internal clock CLK for controlling the operation of the intelligent electronic device IED, for example for controlling the operation of the sampling circuit SC through a control line CTRL, and, if specified, for executing specified protection and/or control functions on the basis of the measured input signal values read from the memory MM or straight from the sampling circuit CS through a command line CL for example for opening a circuit-breaker of a feeder in a case of a fault on the feeder. FIG. 2 shows schematically also the data transmission line DL, through which the content of the memory MM of the intelligent electronic device IED can be transmitted to the substation computer ESC, for example. FIG. 2 also shows another filter FD, which can be used to filter the sample sequence SS stored into the memory MM for further reducing disturbances present in the sample sequence before transmitting the sample sequence SS to the substation computer ESC for further analysis. The function of the filter FD is considered more detailed later.

FIG. 2 discloses schematically the internal structure of an intelligent electronic device which can be used for taking, collecting or measuring samples of an electrical quantity EQ of an electrical network EN to be measured. The intelligent electronic device can also include the measuring sensors for measuring the input signal or the measurement signal corresponding to the electrical quantity. In an exemplary embodiment, the intelligent electronic device can be connected to the measurement sensors providing the input signal, as is shown in FIG. 2. The internal structure of different kinds of intelligent electronic devices can also vary in many other ways and, when considering the solution presented in the present disclosure, the only important ability of the intelligent electronic device is to take, collect or measure samples of an electrical quantity EQ of an electrical network EN.

Figure 3:
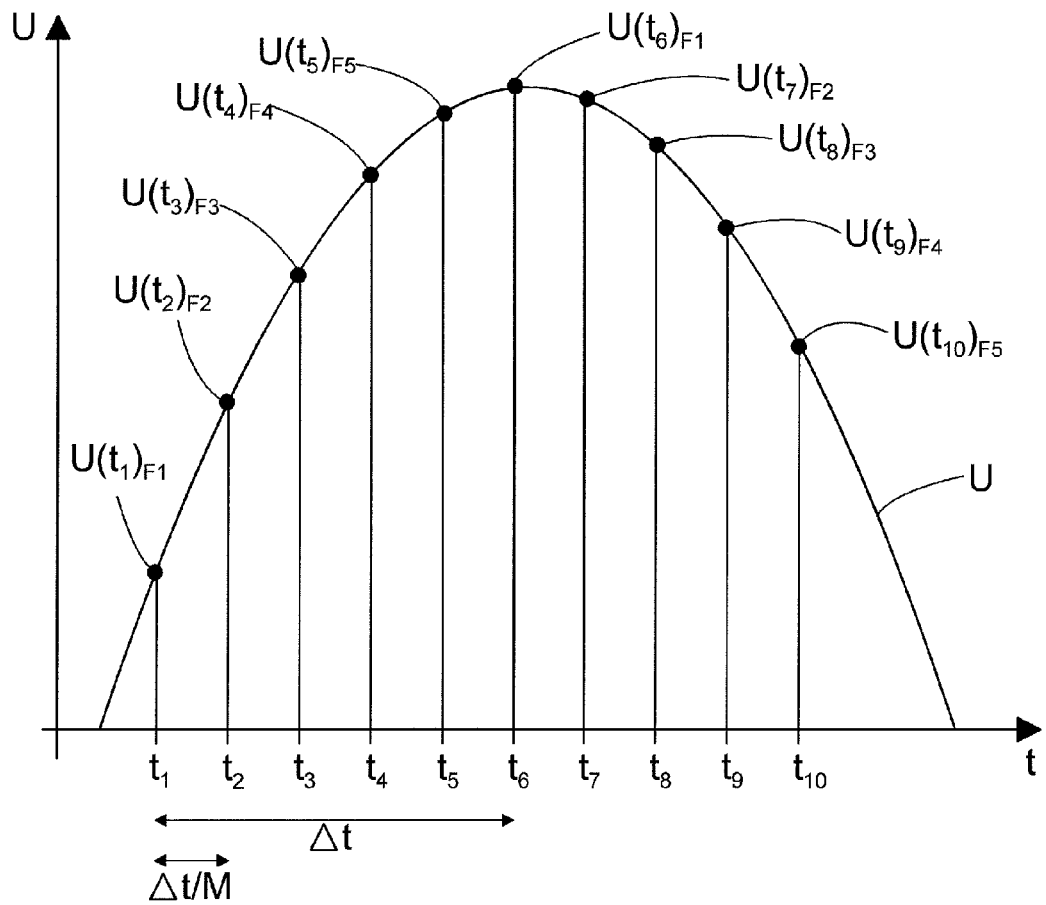
FIG. 3 is a schematic illustration of a first measurement principle of an electrical quantity in an electrical network in accordance with an exemplary embodiment of the present disclosure.
Figure 4:
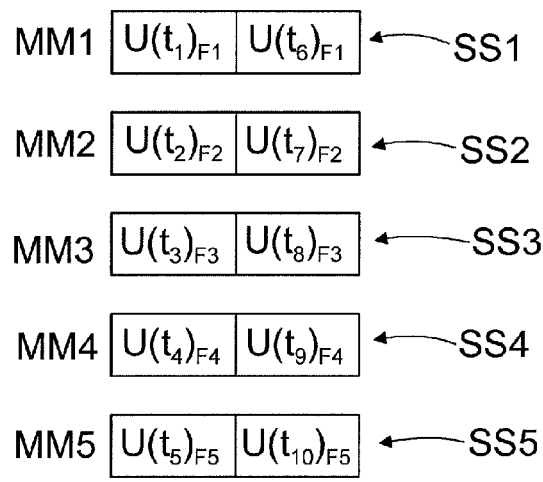
FIG. 4 is a schematic illustration relating to the operation of the first measurement principle relating to FIG. 3 in accordance with an exemplary embodiment of the present disclosure.
Figure 5:
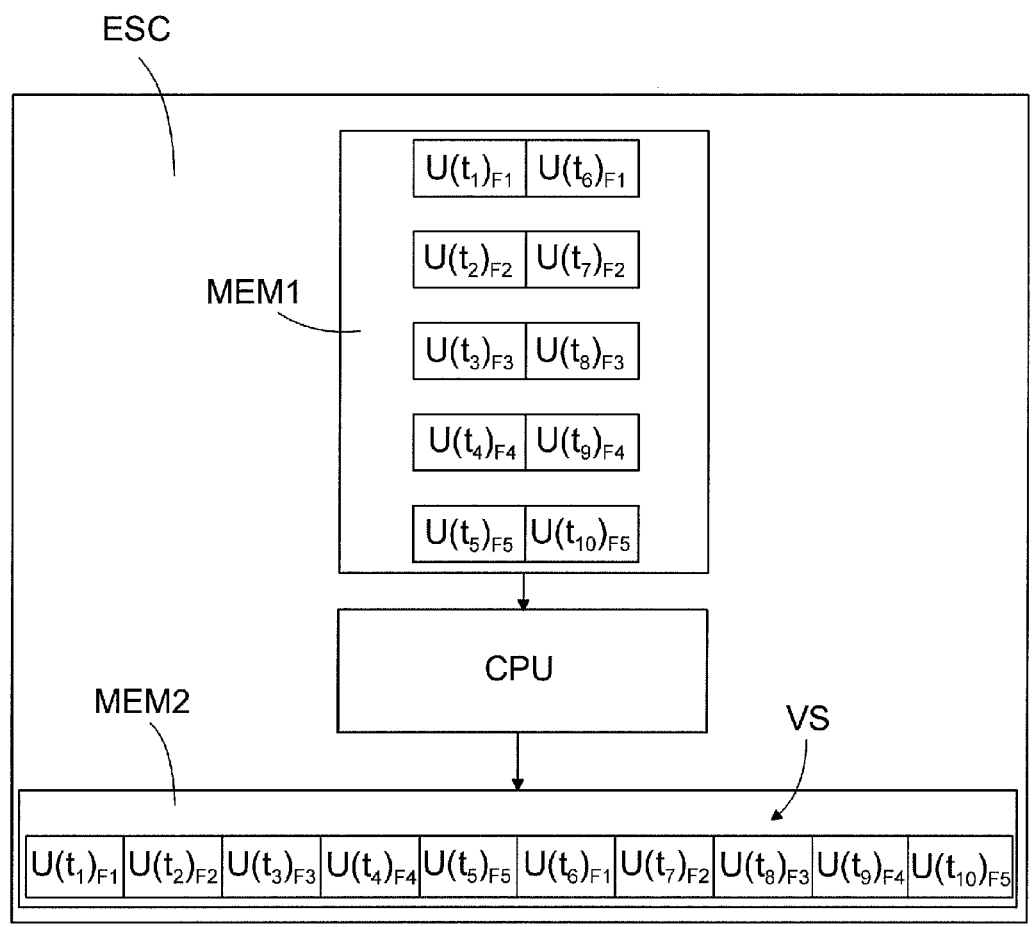
FIG. 5 is a schematic illustration of a substation computer in accordance with an exemplary embodiment of the present disclosure.

FIGS. 3, 4 and 5 present a first measuring principle for measuring an electrical quantity EQ according to the solution presented in this description, when the phase voltage U is the electrical quantity EQ to be measured. FIG. 3 presents schematically phase voltage U, y axis of FIG. 3 representing the value of the phase voltage U and x axis of FIG. 3 representing time t. FIG. 4 presents schematically the memory contents MM1 to MM5 of each intelligent electronic devices IED1 to IED5 after ten samples of phase voltage U have been measured. FIG. 5, in turn, presents schematically the internal structure and functionality of the substation computer ESC for organizing the samples measured by each intelligent electronic device IED1 to IED5 into specific order for providing the phase voltage U measurement with higher sampling frequency than the sampling frequency $f_s$ of any individual intelligent electronic device IED1 to IED5.

According to the solution each intelligent electronic device IED1 to IED5 is arranged to take, collect or measure samples of the phase voltage U at the same sampling frequency $f_s$ as any other intelligent electronic device in the same electrical network EN. Each intelligent electronic device IED1 to IED5 is, however, arranged or synchronized to measure the phase voltage samples in turns such that only one intelligent electronic device at a specific feeder is arranged to take one sample of phase voltage U at a specific time instant, and after that, another intelligent electronic device at another feeder is arranged to measure one sample of phase voltage U, the other intelligent electronic devices being again idle at that time, when considering the sampling of the phase voltage U. The samples of the electrical quantity are thus measured in such a way that after one sample of the electrical quantity EQ is measured at a specific feeder, a new sample of the same electrical quantity is measured at a different feeder, and so on.

So, in the example relating to FIGS. 3, 4 and 5, the intelligent electronic device IED1 at feeder F1 is arranged to measure at a time instant $t_1$ a sample of the phase voltage U, the value of this sample being $U(t_1)_{F1}$ and corresponding the value of the phase voltage U at time instant $t_1$ and being stored into the memory MM1 of the intelligent electrical device IED1 as shown schematically in FIG. 4. At the time instant $t_1$ the other intelligent electronic devices IED2 to IED5 are idle when considering the sampling of the phase voltage U. Next, at time instant $t_2$ the intelligent electrical device IED2 at feeder F2 is arranged to measure a sample of the phase voltage U, the value of this sample being $U(t_2)_{F2}$ and stored into the memory MM2 of the intelligent electronic device IED2. Again, at the time instant $t_2$ the other intelligent electronic devices IED1 and IED3 to IED5 are idle when considering the sampling of the phase voltage U.

After this, the next sample of the phase voltage U is measured at time instant $t_3$ by intelligent electronic device IED3 at the feeder F3, the value of the sample being $U(t_3)_{F3}$ and stored into the memory MM3 of the intelligent electronic device IED3, the other intelligent electronic devices IED1, IED2, IED4 and IED5 being again idle when considering the sampling of the phase voltage U. In a similar way, next samples of the phase voltage U are measured at time instant $t_4$ by the intelligent electronic device IED4 at feeder F4, the value of this sample being $U(t_4)_{F4}$ and at time instant $t_5$ by the intelligent electronic device IED5 at feeder F5, the value of this sample being $U(t_5)_{F5}$, the values of the samples being stored correspondingly into the memories MM4 and MM5 of the intelligent electronic devices IED4 and IED5. The next sample of phase voltage U is measured again by the intelligent electronic device IED1 at feeder F1, the value of this sample being $U(t_6)_{F1}$, and the measurement of the phase voltage U continues as explained above.

In the exemplary measurement solution above, each intelligent electronic device IED1 to IED5 at different feeders F1 to F5 in the electrical network EN are arranged to measure samples of the phase voltage U in turns, one sample at a time at different time instants $t_i$, i=1, . . . , 10 in this example. When the sampling frequency $f_s$ of each intelligent electronic device IED1 to IED5 is 2 kHz, the sampling interval $\Delta t$ between the consecutive samples of the same intelligent electronic device being then $\Delta t=1/2000=500$ µs. However, when each of the intelligent electronic device IED1 to IED5 is arranged to collect samples of the same electrical quantity EQ as shown above, the sampling interval between the consecutive samples of all the collected samples is $\Delta t/M = \Delta t/5 = 500/5$ µs=100 µs, M=5 corresponding to the number of the intelligent electronic devices taken part in collecting the samples of the same electrical quantity EQ in this example. The sampling interval 100 µs corresponds to a sampling frequency of 10 kHz, which is fivefold when compared to the original sampling frequency of each intelligent electronic device IED1 to IED5.

So, by arranging different intelligent electronic devices having the same sampling frequency $f_s$ but configured to take samples at different time instants at different feeders or locations of the electrical network to measure the same electrical quantity, in this example phase voltage U, in turns one sample at a time, it is possible to increase the actual sampling frequency of the electrical quantity EQ to be measured without increasing the original sampling frequency $f_s$ of the intelligent electronic devices. The measurement may thus take place at a feeder, for example, at a connection point of the feeder at the substation, or at a location being in connection with the feeder, such as in an equipment like a motor, a transformer or a generator, connected to the feeder. At hardware level this means, that by only configuring the intelligent electronic devices already in use at different feeders or locations of the network to take samples at different time instants, the sampling frequency of the electrical quantity to be measured may be considerably increased without increasing the sampling frequency of any individual intelligent electronic device. Therefore the overall sampling frequency of the electrical quantity to be measured can be multiplied by the number of the intelligent electronic devices to be used for the measurement without creating any extra costs relating to hardware or its installation. Further this means that it is possible to measure the higher order harmonics than before, as well as multiply the number of transient samples for fault location calculation and thereby increase the accuracy of fault location estimation.

FIG. 4 shows schematically the contents of the memories MM1 to MM5 of the intelligent electronic devices IED1 to IED5 after measuring the samples of the phase voltage U at time instants $t_1$ to $t_{10}$ shown in FIG. 3. After the measurement the memory MM1 of the intelligent electronic device IED1 contains a sample sequence SS1 of two samples taken at time instants $t_1$ and $t_6$ at feeder F1, e.g., the samples $U(t_1)_{F1}$ and $U(t_6)_{F1}$. Further the memory MM2 of the intelligent electronic device IED2 contains a sample sequence SS2 of two samples taken at time instants $t_2$ and $t_7$ at feeder F2, e.g., the samples $U(t_2)_{F2}$ and $U(t_7)_{F2}$. In a similar way, the memories MM3 to MM5 of the intelligent electronic devices IED3 to IED5 contain sample sequences SS3 to SS5 including the samples taken at the corresponding feeders F3 to F5. So, a number of sample sequences SS1 to SS5 of a same electrical quantity EQ, e.g., the phase voltage U, are measured by a number of intelligent electronic devices such that samples of each sample sequence SS1 to SS5 are measured at different feeders, of the electrical network EN than the samples of any other sample sequence SS1 to SS5. The samples of different sample sequences SS1 to SS5 are measured in turns one sample at a time at different time instants, and the individual samples are stored into the memories of the corresponding intelligent electronic devices in a form of a sample sequences SS1 to SS5. For the sake of clarity of the example presented in FIGS. 3 to 5 only two samples per each feeder F1 to F5 were measured but in practice the number of samples to be measured per each feeder is naturally much higher.

FIG. 5 shows schematically the internal structure and operation of the substation computer ESC to the extent that it relates to the operation of the exemplary measurement solution described above. The substation computer ESC includes a first memory MEM1, into which the content of the memories MM1 to MM5 of the intelligent electronic devices IED1 to IED5 may be transmitted via the data transmission lines DL1 to DL5. The content of each memory MM1 to MM5 of the intelligent electronic devices IED1 to IED5 may be transmitted to the first memory MEM1 of the substation computer in such a way that the whole sample sequences SS1 to SS5 stored into the memories MM1 to MM5 are transmitted at a time. The central processing unit CPU of the substation computer ESC is arranged to create a value sequence VS on the basis of the samples of the sample sequences SS1 to SS5. An individual value of the value sequence VS corresponds to a specific sample of some sample sequence SS1 to SS5 such that the values of the value sequence VS are arranged into an order corresponding to the chronological order of the samples in the sample sequences SS1 to SS5. This means that the sample $U(t_1)_{F1}$ taken at time instant $t_1$ is arranged to be the first value in the value sequence VS, the sample $U(t_2)_{F2}$ taken at time instant $t_2$ is arranged to be the second value in the value sequence VS and so on. The value sequence VS can be stored for example into a second memory MEM2 of the substation computer ESC, which memory MEM2 may physically be in the same physical memory device as the first memory MEM1. The value sequence VS stored in memory MEM2 can be utilized for example for fault location calculation, if the samples collected relate for example to a voltage transient phenomenon occurring at the beginning of an earth fault.

In the example above, the sample sequences SS1 to SS5 were transmitted from the intelligent electronic devices IED1 to IED5 to the substation computer ESC a sample sequence at a time, but it is also possible that the individual samples collected by the intelligent electronic devices IED1 to IED5 can be transmitted from each intelligent electronic device IED1 to IED5 to the substation computer ESC immediately after the sampling event so that no special sample sequences SS1 to SS5 are formed into the memories MM1 to MM5 of the intelligent electronic devices IED1 to IED5. In this case the value sequence VS can for example be created directly into the second memory MEM2 of the substation computer ESC without storing the samples temporarily into the memories MM1 to MM5 of the intelligent electronic devices IED1 to IED5.

With the measurement principle explained above, the sampling frequency of the phase voltage U can be multiplied without increasing the actual sampling frequency $f_s$ of any individual intelligent electronic device IED. The same measurement principle can be used for measuring the zero voltage $U_0$ too because the phase voltages and the zero voltage of the electrical network are same in the whole galvanically interconnected electrical network.

Figure 6:
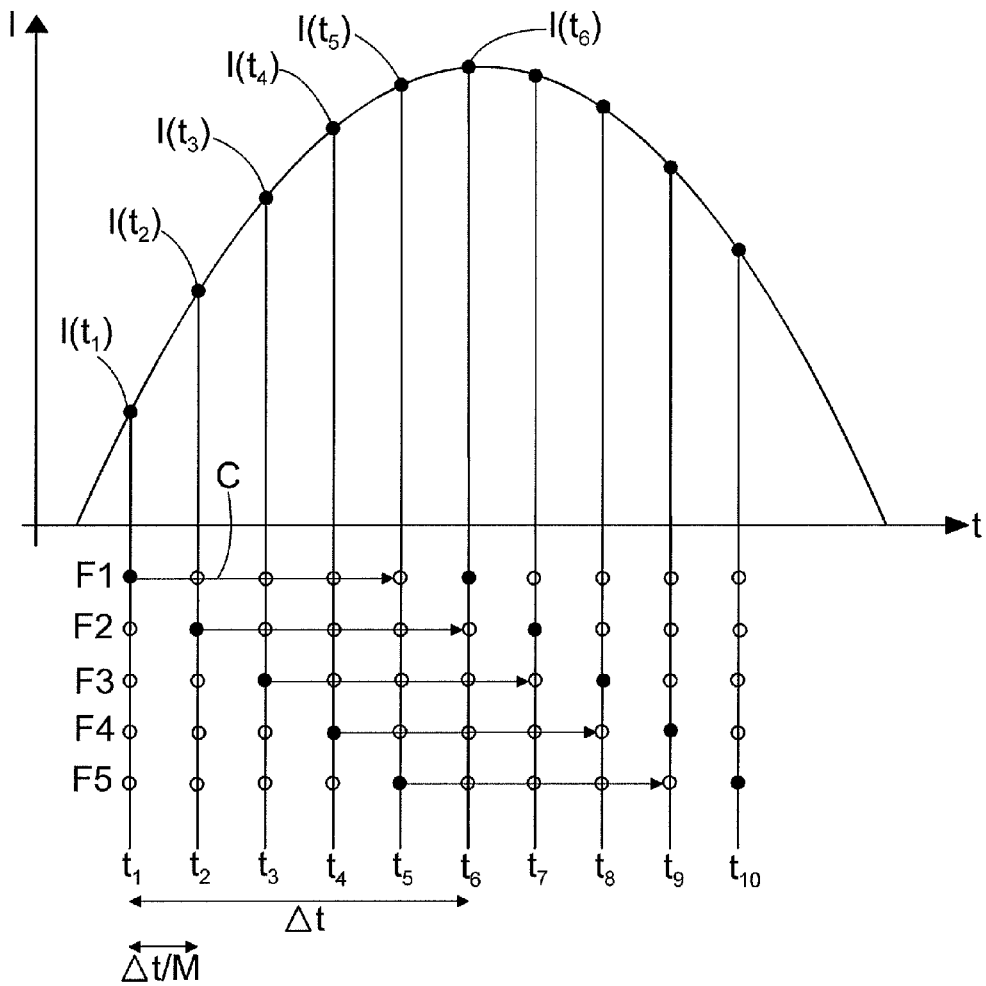
FIGS. 6 and 7 are schematic illustrations of a second measurement principle of an electrical quantity in an electrical network in accordance with an exemplary embodiment of the present disclosure.
Figure 7:
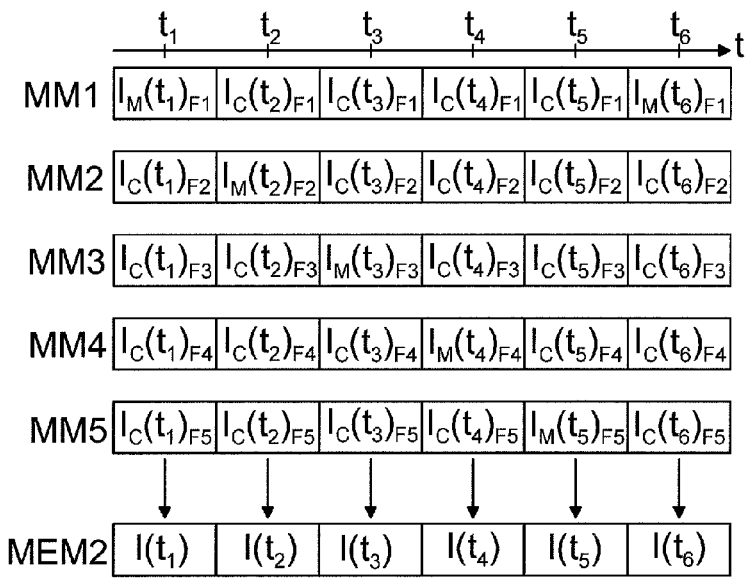

FIGS. 6 and 7 are schematic illustrations of a second measurement principle of an electrical quantity in an electrical network in accordance with an exemplary embodiment of the present disclosure. Namely, FIGS. 6 and 7 show the measurement principle of the electrical quantity EQ in the electrical network EN in a case, wherein the electrical quantity to be measured is a phase current I. The structure of the intelligent electronic device IED is same kind as disclosed in FIG. 2 and the related description.

Because the phase current I can be in practice different at every feeder F1 to F5, depending on the load connected to the feeder, the measurement method for measuring the phase current I is somewhat different when compared to the measurement method of phase voltage U. This limitation, however, can be at least partially compensated by applying Kirchhoff's current law, according to which at a specific point of an electrical network EN the sum of the incoming currents, e.g., current in incoming feeder F1 in this example, is equal to the sum of the outgoing currents and, e.g., currents in the outgoing feeders F2 to F5. This condition leads to a measurement method of phase current I, in which at each time instant $t_i$ it is taken or measured one actual measurement value with one intelligent electronic device at one feeder. For the same time instant $t_i$, it is provided an estimated values for the phase currents I at the other feeders, the last measured sample at each feeder being a starting value for the estimation at each specific feeder. The estimated values can be provided for example by linear interpolation, e.g., linear interpolation is used for calculating virtual measurement points or values at each specific feeder between actual measurement points or values at that specific feeder. With this procedure there are obtained from each time instant $t_i$ one actual or real measurement at one feeder and several virtual interpolated measurements at the other feeders.

The above exemplary measurement method is shown by way of an example in FIGS. 6 and 7, wherein FIG. 6 shows a phase current I with respect to time t, and FIG. 7 shows the content of the memories MM1 to MM5 of the intelligent electronic devices IED1 to IED5 and the content of memory MEM2 of the substation computer ESC. At time instant $t_1$ the value of phase current I is measured at feeder F1, this sample being denoted by $I_M(t_1)_{F1}$ and this value is stored into the memory MM1 of the intelligent electronic device IED1. For the same time instant $t_1$ it is calculated, for example by using linear interpolation, estimated values for the phase current I at the other feeders F2 to F5 on the basis of the previously actually measured values (not shown) at each specific feeder F2 to F5, the calculated values being $I_C(t_1)_{F2}$ at feeder F2, $I_C(t_1)_{F3}$ at feeder F3, $I_C(t_1)_{F4}$ at feeder F4 and $I_C(t_1)_{F5}$ at feeder F5, these values being stored at the memories MM2 to MM5 of each specific intelligent electronic device IED2 to IED5. In the lower part of FIG. 6, for each feeder F1 to F5 the actually measured values are schematically denoted by filled dots and the calculated values are denoted by circles for each time instant $t_i$, wherein I=1, . . . , 10. The period of time between successive time instants $t_i$, is $\Delta t/M$, where $\Delta t$ is the sampling interval corresponding to the sampling frequency $f_s$ of each intelligent electronic device and M is the number of active or operating intelligent electronic devices in the measurement system.

At time instant $t_2$ the phase current I is measured at feeder F2, this measurement value being denoted by $I_M(t_2)_{F2}$ and this value is stored into the memory MM2 of the intelligent electronic device IED2. For the same time instant $t_2$ it is again calculated or estimated, for example by using linear interpolation, values for the phase current I at the other feeders F1 and F3 to F5 on the basis of the previously actually measured values at each specific feeder F1 and F3 to F5. This means that the calculated value $I_C(t_2)_{F1}$ at feeder F1 at time instant $t_2$ is provided by using linear interpolation on the basis of the actually measured value $I_M(t_1)_{F1}$ at feeder F1 at time instant $t_1$. The arrow marked by reference mark C in the lower part of FIG. 6 denotes that for all time instants $t_2$, $t_3$, $t_4$ and $t_5$ the value of phase current I at feeder F1 is calculated or estimated on the basis of the last actually measured phase current value $I_M(t_1)_{F1}$ for that specific feeder F1. At the other feeders F3 to F5 values for the phase current I at time instant $t_2$ is again interpolated on the basis of the last actually measured values (not shown in FIG. 6) at each specific feeder F3 to F5, the calculated values being $I_C(t_2)_{F3}$ at feeder F3, $I_C(t_2)_{F4}$ at feeder F4, and $I_C(t_2)_{F5}$ at feeder F5, these values being stored at the memories MM3 to MM5 of each specific intelligent electronic device IED3 to IED5.

This same principle is continued for the next time instants $t_i$. After the measurement situation is over, the content of the memories MM1 to MM5 can be transmitted to the substation computer ESC, wherein, by the operation of central processing unit CPU, the value for the phase current $I(t_i)$ at each time stamp $t_i$ may be determined by a function $f(I_M, I_C, t_i)$, e.g., $I(t_i)=f(I_{Mi}, I_{Ci}, t_i)$, wherein $I_{Mi}$ denotes the actually measured phase current value at one feeder at time instant $t_i$, $I_{Ci}$ denotes the calculated or estimated phase current values at the other feeders at time instant $t_i$. When determining the phase current $I(t_i)$, the function $f(I_M, I_C, t_i)$ can apply Kirchhoff's current law according to which the sum of the actually measured phase current value at one feeder and the calculated or estimated phase current values at the same time instant $t_i$ should be zero for every time instant $t_i$ by adding to the interpolated values possible residual errors caused by the interpolation. The residual error can be added to the interpolated values, for example, on the basis of the magnitudes of the phase currents at each feeder such that the higher the magnitude of the phase current at the feeder, the higher portion of the residual error is added to the interpolated values relating to that specific feeder. For example, the RMS-value of the phase current can describe the magnitude of the phase current. The phase current values $I(t_1)$, $I(t_2)$ and so on determined for every time instant $t_i$ are then stored for example in the second memory MEM2 of the substation computer ESC.

In the example above, the calculation or estimation of the phase current values was executed in the central processing unit CPU of each specific intelligent electrical device IED1 to IED5, but it could be done also in the central processing unit CPU of the substation computer ESC, if only the actually measured phase current values are transmitted to the substation computer ESC.

Instead of calculating any estimated values by using for example linear interpolation it is also possible to add zeros between the actually measured phase current values. In this example, four zeros should be added between the actually measured phase current values for increasing the sampling frequency to be fivefold, e.g., 10 kHz, at each feeder F1 to F5, and then use a low pass filter to remove the signal having the frequency of 2 kHz, e.g., the frequency of the original sampling frequency, originating from the adding of zeros between the originally measured values. This type of raising the sampling frequency of an individual measurement signal is known and is not described in more detailed here.

Linear interpolation and raising of the sampling frequency by adding zeros are presented in Oppenheim, Alan V.; Schafer, Ronald W. Discrete-Time Signal Processing. Prentice Hall. 1989. ISBN 0-13-216771-9.

In an exemplary embodiment as shown in FIGS. 6 and 7 for the measurement of the phase current I measuring samples of the electrical quantity to be measured, e.g., the phase current I, are measured or collected at different feeders of the electrical network EN in turns one sample at a time at different time instants. Thereafter, value sequence VS is created on the basis of the actually measured phase current samples, and also on the basis of the calculated or estimated phase current values, such that an individual value in the value sequence VS corresponds to a value calculated on the basis of one measured sample at one feeder and one or more estimated values at the other feeders, wherein each estimated value can be provided by using linear interpolation, the linear interpolation using the last measured sample as a starting value for interpolating the estimated value at each specific feeder. The values in the value sequence VS are arranged into an order corresponding to the chronological order of the measured samples. Same measurement principle can be used for measuring the zero current $I_0$ too.

Given the measurement solution described above, a sampling frequency of 10 kHz can be produced with five intelligent electronic devices each having a specified sampling frequency, such as 2 kHz for example. However, each measurement chain, even with identical intelligent electronic devices and sensors, has some unique measurement error which can be compensated before the signal is used for analysis. If, for example, one intelligent electronic device has a small scaling error or an offset error in the measurement, it creates an additional frequency component equal to the sampling frequency, 2 kHz in the above example, which may be filtered out with a low-pass filter incase compensation is not possible. This second low-pass filter is schematically shown in FIG. 2 with a reference mark FD.

According to exemplary embodiments of the present disclosure, calculations for assessing the effect of different mismatches, e.g., gain, offset and timing mismatches between different intelligent electronic devices, and for understanding the possible compensation needs of the measurements are described below. If gain, offset and timing mismatches are assumed to have Gaussian distribution, the combined effect to signal-to-noise-ratio SINAD may be determined by the following equation (1)

$$SINAD = 10\log_{10}\left(\frac{A^2}{2M}\left(\mu_g^2((M-1)e^{-4\pi^2 a_0^2 \sigma_{r1}^2} + 1) + \sigma_g^2\right)\right) - \quad (1)$$

-continued
$$10\log_{10}\left(\frac{A^2}{2M}(M-1)(\mu_g^2(1 - e^{-4\pi^2 a_0^2 \sigma_{r1}^2}) + \sigma_g^2) + \sigma_o^2\right),$$

wherein
A is an amplitude of the input signal,
M is an amount of intelligent electronic devices,
$\mu_g$ is an expected value of the gain of an analog-to-digital converter in an intelligent electronic device,
$a_0$ is an input signal frequency relative to the sampling frequency of one intelligent electronic device,
$\sigma_g$ is a standard deviation from the expected gain,
$\sigma_{r1}$ is a standard relative timing deviation of an analog-to-digital converter in an intelligent electronic device,
$\sigma_o$ is a standard deviation of the offset.

As in known substation automation systems, an individual analog-to-digital-converter of an intelligent electronic device plays an important role, hence equation (1) of the exemplary embodiments disclosed herein are arranged to take into account variations of each single intelligent electronic devices, thus making the results more descriptive. In equation (1), for example 1 μs deviation with sampling frequency of 1 kHz per device, sampling interval being then 1 ms, means that the value $\sigma_{r1}$ is 0.001, regardless of the amount of analog-to-digital converters used. Also when investigating the effect of multiple measurements, it should be considered the quantity $a_0$, e.g., the input signal frequency relative to the sampling frequency of one intelligent electronic device. In equation (1) $a_0$ thus indicates the input signal frequency relative to the sampling frequency of one intelligent electronic device, $a_0$ being 0.5 if the input signal frequency is 1 kHz with 2 kHz sampling frequency.

Figure 8:
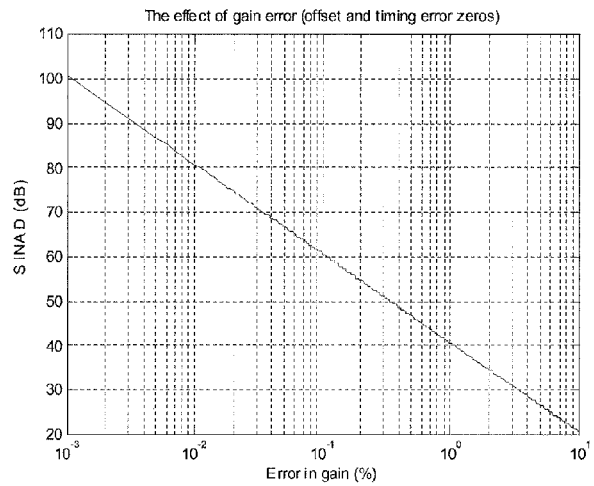
FIG. 8 is a schematic illustration of the effect of a gain error of an intelligent electronic device on a signal-to-noise-ratio in accordance with an exemplary embodiment of the present disclosure.
Figure 9:
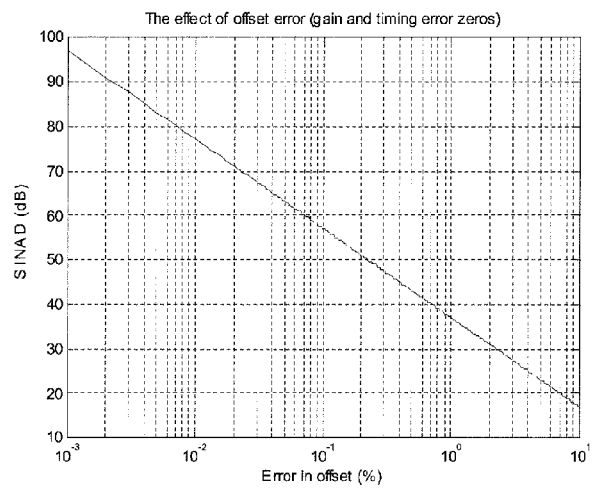
FIG. 9 is a schematic illustration of the effect of an offset error of an intelligent electronic device on a signal-to-noise-ratio in accordance with an exemplary embodiment of the present disclosure.
Figure 10:
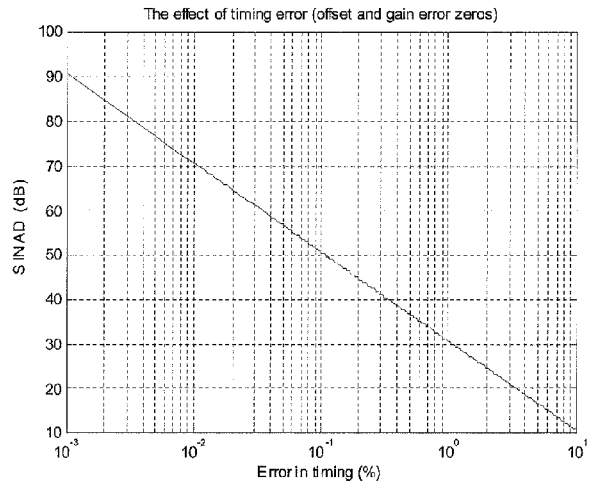
FIG. 10 is a schematic illustration of the effect of a timing error on a signal-to-noise-ratio in accordance with an exemplary embodiment of the present disclosure.

The effect of the deviations of individual components can be derived from equation (1) by setting other deviations to zero—for example, the effect of timing deviation is well visible when both gain and offset deviations are set to zero. The graphical results of these derivations are visible in FIGS. 8, 9 and 10, wherein FIG. 8 is a schematic illustration of the effect of a gain error of an intelligent electronic device on a signal-to-noise-ratio in accordance with an exemplary embodiment of the present disclosure. FIG. 9 is a schematic illustration of the effect of an offset error of an intelligent electronic device on a signal-to-noise-ratio in accordance with an exemplary embodiment of the present disclosure. FIG. 10 is a schematic illustration of the effect of a timing error on a signal-to-noise-ratio in accordance with an exemplary embodiment of the present disclosure and when it is assumed that M is 8, $\mu_q$ is 1 and $a_0$ is 0.5.

Figure 11:
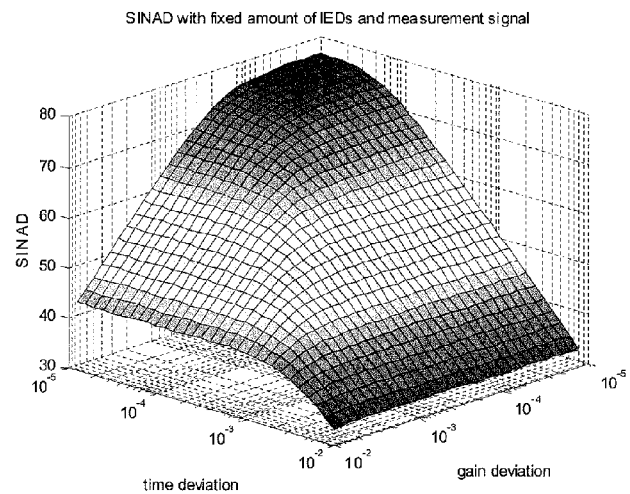
FIGS. 11 and 12 are schematic illustrations of a gain and timing error on a signal-to-noise-ratio in accordance with an exemplary embodiment of the present disclosure.
Figure 12:
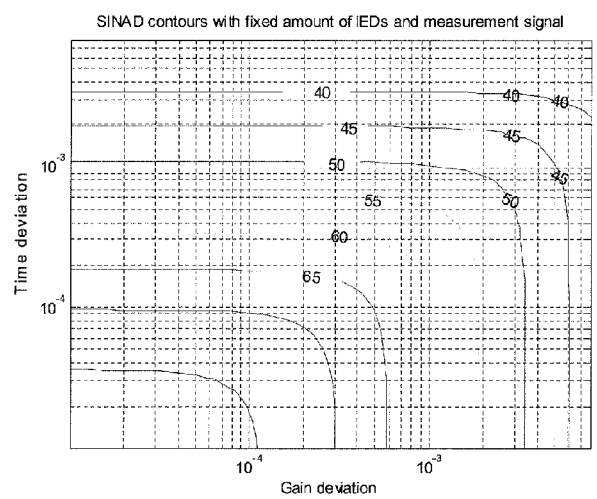

FIGS. 8, 9 and 10 provide the maximum possible signal-to-noise-ratio SINAD if the error in one component is known. If the timing error can be 1% of the sampling interval of one intelligent electronic device, the maximum possible SINAD according to FIG. 10 is around 30 dB no matter how identical the measurement chains otherwise are. In the measurement chain of an intelligent electronic device the offset error is normally negligible, and the effect of it can be skipped. FIGS. 11 and 12 are schematic illustrations of a gain and timing error on a signal-to-noise-ratio in accordance with an exemplary embodiment of the present disclosure. The measurement chain includes the combined effect of gain and timing mismatches, which are shown schematically in FIGS. 11 and 12, when M is 8, $\mu_q$ is 1 and $a_0$ is 0.5. The combined effect is well visible in FIG. 12 showing the contours of the combined effect. From FIG. 12, it can for example be seen that SINAD over 50 dB can only be achieved when both the timing deviation is below 0.001 and the gain deviation is below 0.003.

Figure 13:
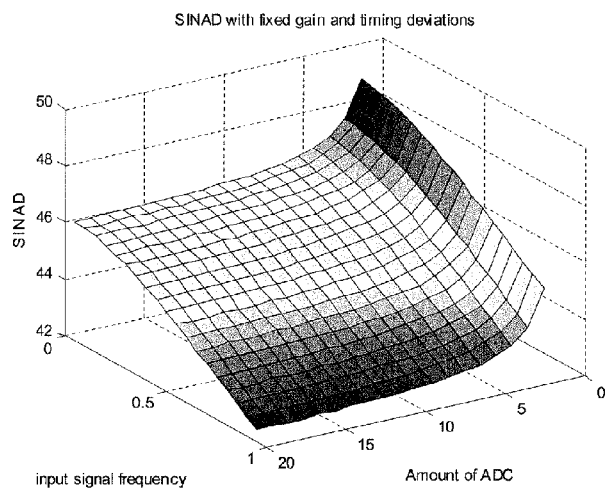
FIG. 13 is a schematic illustration of an effect of additional intelligent electronic devices on a signal-to-noise-ratio in accordance with an exemplary embodiment of the present disclosure.

FIG. 13 is a schematic illustration of an effect of additional intelligent electronic devices on a signal-to-noise-ratio in accordance with an exemplary embodiment of the present disclosure. Namely, FIG. 13 shows schematically the effect of additional intelligent electronic devices on the signal-to-noise-ratio when the number of intelligent electronic devices in the measurement system increases. In FIG. 10 is $\sigma_g$ is 0.005, $\sigma_{r1}$ is 0.001, $\sigma_o$ is 0 and $\mu_q$ is 1.

In FIG. 13 it can be seen that the signal-to-noise ratio SINAD can get slightly worse when the amount (e.g., number) of intelligent electronic devices, e.g., the amount of analog-to-digital-converters increases, but not greatly. This value indicates that the signal quality would remain on the same level, which is the most important aspect with transient based algorithms. Transients last only few milliseconds, so the main aspect is that the amount of data points can be increased without a major effect to the SINAD-value.

According to calculations presented above the timing mismatch of samples should not exceed 0.1% of the sampling interval Δt if gain accuracy is around 0.5%. With the sampling frequency of 2 kHz the sampling interval is 0.5 ms which gives time accuracy specifications of 0.5 μs with 0.1% accuracy. This result can be ensured by synchronizing the internal clock CLK in each intelligent electronic device with respect to the clocks CLK in other intelligent electronic devices such that each intelligent electronic device is arranged to take samples at its own turn at specific time instants. Therefore, the clock controlling the analog-to-digital controller, if the sampling circuit SC includes a clock separate from the clock CLK in central processing unit, can be arranged in the same clock synchronization process.

For synchronization purposes each intelligent electronic device includes a settable time offset such that when one intelligent electronic device, for example intelligent electronic device IED1, is running in sync with the synchronization master (offset=0), which can include the substation computer ESC, other intelligent electronic devices IED2 to IED5 should have an offset time with multiples of $(1/M/f_s)$ where M is the amount of intelligent electronic devices in the measurement system and $f_s$ is the sampling frequency. For example, if 5 intelligent electronic devices with 2 kHz sampling frequency are synchronized from the same synchronization master, the offset time for the intelligent electronic device IED1 at feeder 1 may be 0, the offset time for the intelligent electronic device IED2 is 1/5/2000=100 μs, and the offset times for other intelligent electronic devices IED3 to IED5 are 200 μs, 300 μs, and 400 μs. The synchronization can be controlled by the substation computer ESC, which can send a synchronization control signal SYNC to each intelligent electronic device IED1 to IED5 when specified. In an exemplary embodiment of the present disclosure, the system can include a separate synchronization master which synchronizes also the substation computer ESC. By synchronization it is possible to compensate timing mismatches in the measurement system. The synchronization control signal SYNC is shown schematically in FIGS. 1 and 2 by an arrow.

The settable offset times of intelligent electronic devices IED1 to IED5 ensure also that the measurement system is applicable also in situations where the network topology changes, in which case if an intelligent electronic device is behind a circuit breaker, a change in network topology for example, due to a fault can remove one intelligent electronic device from the measurement chain or system. Because of this, centralized logic should be implemented to the substation which takes this aspect into account. If one intelligent electronic device measurement is missing, new timing offset values should be calculated and provided to the remaining intelligent electronic devices so that the measurement system can resume operation with M−1-measurements. In this case, the sampling interval Δt of an individual intelligent electronic device remains same but the period of time between the samples taken by different intelligent electronic devices increases. As indicated earlier, this does not, however, affect greatly to the SINAD of the measurement signal, but the amount of data points for transient analysis is reduced. The measurement system is therefore arranged to take the network topology changes into account and to change the functionality of the measurement system, such as the number of intelligent electronic devices used for the measuring, the period of time between the samples taken by different intelligent electronic devices and the sampling order of different intelligent electronic devices accordingly.

As disclosed above, the timing mismatches can be minimized by synchronizing the intelligent electronic devices as exactly as possible by using settable offset times in each intelligent electronic device. This is one way to compensate the possible measurement errors during the measurement of the electrical quantity EQ. Because in a substation the measurement signal of one intelligent electronic device should also be used for protection purposes, an extensive signal processing, such as RMS (Root-Mean-Square)-Calculation or DFT (Discrete Fourier Transform)-calculation is already done. This brings new possibilities, such as, to the gain mismatch compensation because the gain mismatch can for example be compensated by comparing the fundamental frequency phasors of the measured electrical quantity obtained by different intelligent electronic devices at different feeders.

FIGS. 14 to 17 show schematically an example of an effect of a sampling frequency relating to earth fault location estimation in accordance with an exemplary embodiment of the present disclosure. An example relating to FIGS. 14 to 17 illustrates an effect of the measurement solution presented above. The example relates to a transient analysis for earth fault location estimation. When an earth fault occurs in a network with an isolated neutral, there can be a fast transition, called a transient, present. When the voltages on phases change, the charge in them has to change too. During the transient there is a current flowing from one phase to another to compensate the change in the network. When the charge of supply lines reaches the new equilibrium, the transient slowly decays.

The transient consists mainly of two components which are called a discharge component and a charge component. In addition there are interline compensating components, the function of which is to equalize the voltages of parallel lines at their substation terminals. In compensated networks there is also a decaying DC-component (Direct Current), which is due to a compensation coil. The discharge component results from the decrement of the voltage in faulted phase. When the voltage in the faulted phase decreases, the electric charge in the cables has to decrease as well. Simultaneously the voltages in sound phases rise, and these cables can reserve more energy. This shows in the voltage as a charge component. Because the charge component flows through a substation transformer, the frequency of it is much less than of the discharge component. The amplitude of the charge component dominates the transient, which makes it more suitable for fault location estimation purposes. The frequency of the discharge component is normally 500 . . . 2500 Hz and the one of the charge component 100 . . . 800 Hz.

Figure 14:
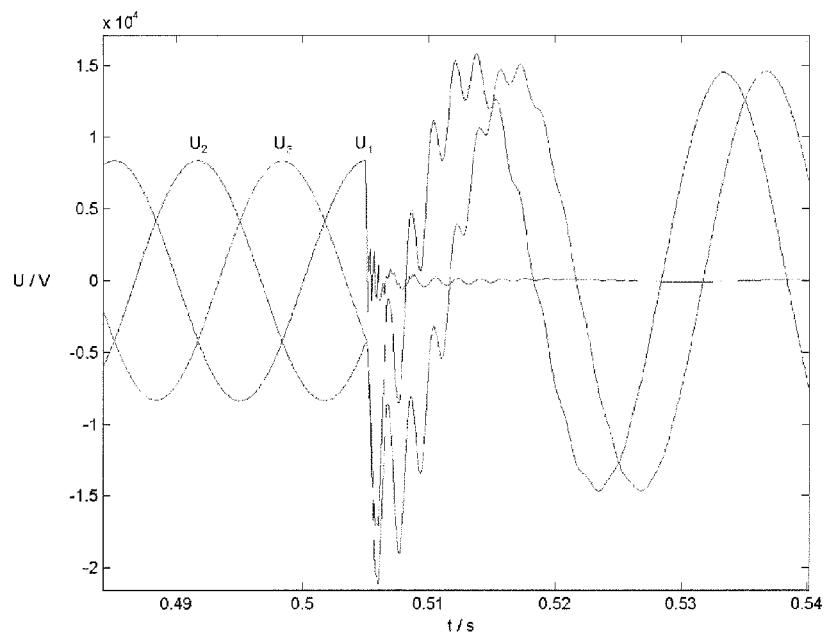
FIGS. 14 to 17 show schematically an example of an effect of a sampling frequency relating to earth fault location estimation in accordance with an exemplary embodiment of the present disclosure.

Because of the higher amplitude and the lower frequency of the charge component earth fault location algorithms used can be based on charge component analysis. In FIG. 14 it is presented an example of phase voltages $u_1$, $u_2$ and $u_3$ at a beginning of an earth fault in an electrical network having an isolated neutral point. FIG. 14 shows clearly, how the phase voltages change during a low resistance earth fault—the voltage of the faulted phase $u_1$ drops close to zero whereas the voltages of the sound phases $u_2$ and $u_3$ rise to phase-to-phase voltage.

Figure 15:
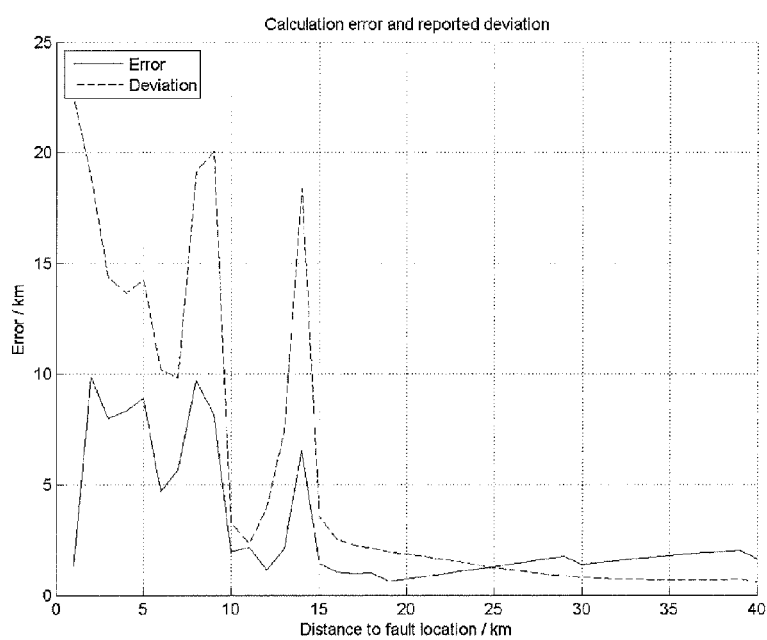
Figure 16:
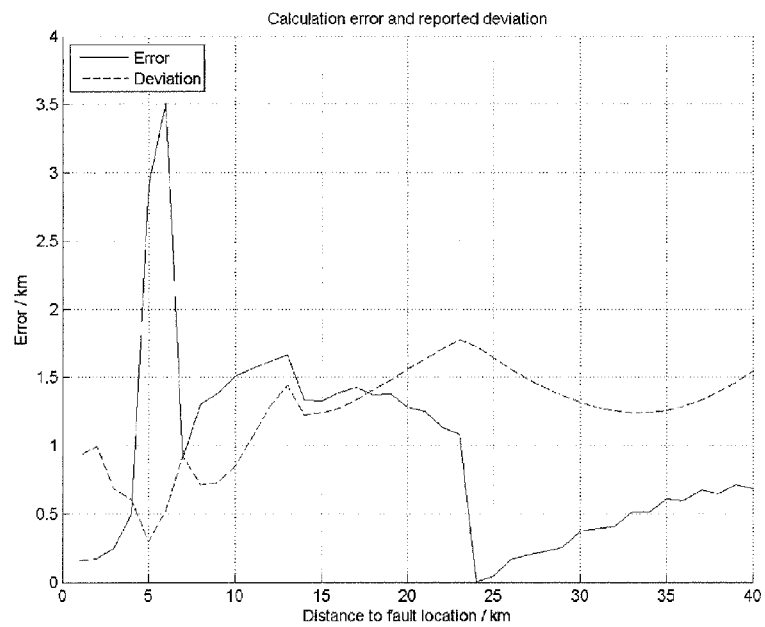
Figure 17:
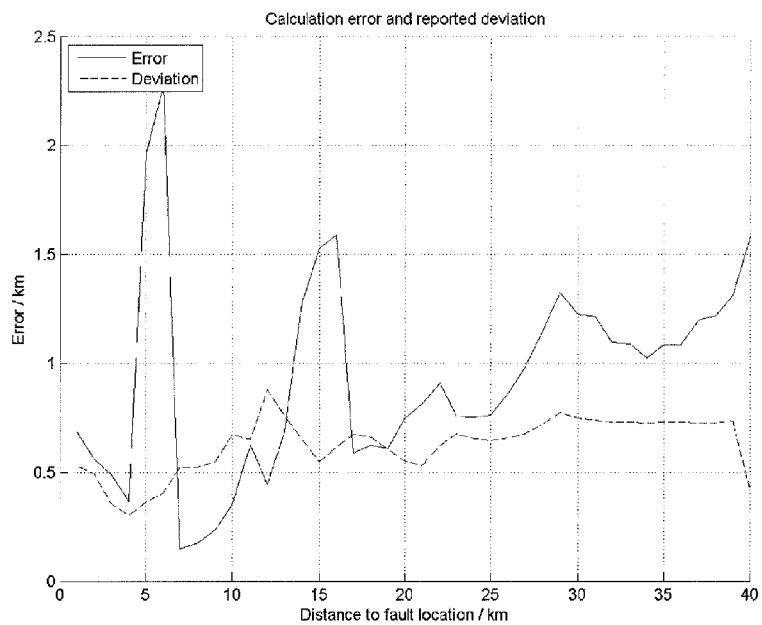

FIGS. 15 to 17 show an example of the effect of the sampling frequency of the phase current I and phase voltage U measurements on the performance of an earth fault location algorithm, which determines the distance to fault by analyzing the charge transient. These Figures show the error of the calculated distance to fault reported by the algorithm, when the fault distance varies between 1 and 40 km in an example network. The algorithm also provides the deviation of the calculated distance, which describes the accuracy of the result. In FIG. 15, the sampling frequency applied was 10 kHz by using one measurement instrument and in FIG. 16 the sampling frequency applied was 2 kHz by using one measurement instrument too. In FIG. 17, however, five measurement instruments were used, each measurement instrument having a sampling frequency of 2 kHz and arranged to take samples in turns according to the measurement solution described above.

As shown in FIGS. 15-17, with 5 streams of 2 kHz sampled signal the results are very similar to the results with single measurement instrument with 10 kHz sampling frequency. Using only one stream of 2 kHz sampled signal gives very poor results with short fault distances. The shorter the distance to fault, the higher the frequency of the charge transient. Therefore algorithms with low sampling frequency give bad results.

The exemplary embodiment shows that by combining, as explained above, the measurements made by measurement instruments having low sampling frequencies it is possible to increase the sampling frequency of a measurement signal in an electrical network such that high quality measurement data to be used for power quality and fault location analysis, for example, may be provided.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for measuring an electrical quantity in an electrical network including at least a substation, the method comprising:
   receiving, via at least two intelligent electronic devices, an input or measurement signal describing or corresponding the electrical quantity to be measured;
   measuring samples of the electrical quantity, via each of the at least two intelligent electronic devices, respectively at the different feeders or locations of the electrical network in turns at different feeders or locations one sample at a time and at different time instants such that after a sample of the electrical quantity is measured at a respective feeder or location and at a respective time instant, a next sample of the electrical quantity is measured at a different feeder or location at a next time instant, wherein the measuring of samples of the electrical quantity at other feeders or locations being idle at each time instant the electrical quantity is measured via a respective one of the at least two intelligent electronic devices at the respective feeder or location,
   creating, in one of the at least two intelligent electronic devices a value sequence on the basis of the measured samples, at least one individual value of the value sequence corresponding to a measured sample, or a value calculated on the basis of at least one measured sample, wherein the at least one individual value in the value sequence is arranged in an order corresponding to a chronological order of the measured samples; and
   performing, in one of the at least two intelligent electronic devices a transient analysis on the value sequence to determine a fault location in the electrical network,
   wherein a sampling frequency of the electrical quantity being measured in the network is multiplied by a total number of different feeders or locations at which a sample is measured.

2. The method according to claim 1, wherein
   at least two sample sequences of a same electrical quantity are measured such that samples of each sample sequence are measured at a different feeder of the electrical network than the samples of any other sample sequence, and, the samples of different sample sequences are measured in turns one sample at a time at different time instants, and
   the value sequence is created on the basis of the samples of the at least two sample sequences, the at least one individual value of the value sequence corresponding to a sample of one of the at least two sample sequences or a value calculated on the basis of at least one sample of the at least two sample sequences, wherein the values of the value sequence are arranged in an order corresponding to a chronological order of the samples of the at least two sample sequences.

3. The method according to claim 1, wherein the electrical quantity to be measured is a phase voltage or a zero voltage and the individual values of the value sequence correspond to samples of the measured phase voltage or zero voltage.

4. The method according to claim 1, wherein the electrical quantity to be measured is a phase current or a zero current and the individual values of the value sequence correspond to a value calculated on the basis of one actually measured phase current value at one feeder or location and a calculated or estimated phase current value in at least one other feeder or location of the electrical network.

5. The method according to claim 4, wherein the calculated or estimated phase current value is determined by linear interpolation, and a starting value of the linear interpolation is a last actually measured phase current value at a corresponding feeder or location.

6. The method according to claim 1, wherein measurement errors due to gain, offset, or timing mismatches in the sampling of the electrical quantity are compensated between different feeders or locations of the electrical network.

7. The method according to claim 6, wherein the sampling of the electrical quantity at one feeder or location of the electrical network is synchronized to take place after a time offset relative to the sampling of the electrical quantity at another feeder or location of the electrical network, wherein the time offset minimizes the timing mismatches of the sampling of the electrical quantity.

8. The method according to claim 7, wherein measurement errors in the sampling of the electrical quantity between different feeders of the electrical network due to gain mismatches are compensated on the basis of the fundamental frequency value of the electrical quantity at the different feeders.

9. The method according to claim 6, wherein measurement errors in the sampling of the electrical quantity between different feeders of the electrical network due to gain mismatches are compensated on the basis of a fundamental frequency value of the electrical quantity at the different feeders.

10. The method according to claim 1, wherein the sampling of the electrical quantity at one feeder or location of the electrical network is synchronized to take place after a time offset relative to the sampling of the electrical quantity at another feeder or location of the electrical network and after a number of feeders or locations of the electrical network where the sampling takes place is changed due to network topology changes.

11. The method according to claim 1, comprising:
analyzing the value sequence for a transition among the electrical quantities measured at the different feeders; and
identifying a fault location in the electrical network based on the analysis so that outage time of a respective feeder can be minimized.

12. A system for measuring an electrical quantity in an electrical network including at least a substation, the system comprising:
at least two intelligent electronic devices arranged at different feeders or locations of the electrical network, the at least two intelligent electronic devices being configured to measure the electrical quantity of the electrical network and each intelligent electronic device is configured to measure samples of the electrical quantity in turns at different feeders or locations one sample at a time and at different time instants such that after one sample of the electrical quantity is measured at a respective feeder or location at a respective time instant by an associated intelligent electronic device, a next sample of the electrical quantity is measured at a different feeder or location at a next time instant by another intelligent electronic device associated with the different feeder,
the intelligent electronic devices at other feeders or locations are idle at these time instants when considering the measuring of samples of the electrical quantity, and
one of the intelligent electronic devices is arranged to create a value sequence on the basis of respective measured samples, an individual value of the value sequence corresponding to a measured sample or a value calculated on the basis of at least one measured sample, the values in the value sequence being arranged in a chronological order according to the measured samples; and
one of the intelligent electronic devices is arranged to perform a transient analysis on the value sequence to determine a fault location in the electrical network,
wherein a sampling frequency of the electrical quantity being measured in the network is multiplied by a total number of different feeders or locations in the network at which a sample is measured.

13. The system according to claim 12, wherein:
the one intelligent electronic device is configured to measure samples of the electrical quantity in turns one sample at a time and at different time instants with respect to other intelligent electronic device of the electrical network,
the one intelligent electronic device is configured to create a sample sequence on the basis of the measured samples, the sample sequence including the measured samples in a chronological order, and
the one intelligent electronic device is configured to create the value sequence on the basis of the samples of the sample sequences, an individual value of the value sequence corresponding to a sample of one of the sample sequences or a value calculated on the basis of at least one sample of at least one sample sequence, the values in the value sequence being arranged in an order corresponding to the chronological order of the samples of the sample sequences.

14. The system according to claim 12, wherein the electrical quantity to be measured is a phase voltage or a zero voltage and the individual values of the value sequence correspond to the samples of the measured phase voltage or zero voltage.

15. The system according to claim 12, wherein the electrical quantity to be measured is a phase current or a zero current and the individual values of the value sequence correspond to a value calculated on the basis of one actually measured phase current value at one feeder or location and a calculated or estimated phase current value in at least one other feeder or location of the electrical network.

16. The system according to claim 15, wherein the calculated or estimated phase current value is arranged to be determined by linear interpolation, a starting value of the linear interpolation being the last actually measured phase current value at a corresponding feeder or location.

17. The system according to claim 12, wherein the system is arranged to compensate measurement errors due to gain, offset, or timing mismatches in the sampling of the electrical quantity between intelligent electronic device arranged in the electrical network.

18. The system according to claim 17, wherein the system is configured to synchronize the sampling of the electrical quantity by one intelligent electronic device to take place after a time offset relative to the sampling of the electrical quantity by another intelligent electronic device for minimizing the timing mismatches of the sampling of the electrical quantity.

19. The system according to claim 18, wherein the system is arranged to compensate measurement errors in the sampling of the electrical quantity between different feeders of the electrical network due to gain mismatches on the basis of the fundamental frequency value of the electrical quantity at different feeders.

20. The system according to claim 17, wherein the system is arranged to compensate measurement errors in the sampling of the electrical quantity between different feeders of the electrical network due to gain mismatches on the basis of a fundamental frequency value of the electrical quantity at different feeders.

21. The system according to claim 12, wherein the system is arranged to synchronize the sampling of the electrical quantity by one intelligent electronic device to take place after a time offset relative to the sampling of the electrical quantity by another intelligent electronic device after a number of the intelligent electronic devices arranged to take samples changes due to a change in network topology.

22. The system according to claim 12, wherein the one intelligent electrical device is configured to create the value sequence is configured to analyze the value sequence for a transition among the electrical quantities measured at the different feeders and identify a fault location in the electrical network based on the analysis so that outage time of a respective feeder can be minimized.

* * * * *